US011102897B2

(12) United States Patent
Ford et al.

(10) Patent No.: US 11,102,897 B2
(45) Date of Patent: Aug. 24, 2021

(54) HINGED CABLE MANAGEMENT SYSTEM

(71) Applicant: Oracle International Corporation, Redwood Shores, CA (US)

(72) Inventors: Geoffrey Brian Ford, Beaverton, OR (US); Mickey Ray Alexander, III, Yamhill, OR (US)

(73) Assignee: Oracle International Corporation, Redwood Shores, CA (US)

( * ) Notice: Subject to any disclaimer, the term of this patent is extended or adjusted under 35 U.S.C. 154(b) by 426 days.

(21) Appl. No.: 16/220,426

(22) Filed: Dec. 14, 2018

(65) Prior Publication Data

US 2020/0196472 A1    Jun. 18, 2020

(51) Int. Cl.
*H02G 3/30* (2006.01)
*H05K 5/02* (2006.01)

(52) U.S. Cl.
CPC ............. *H05K 5/0247* (2013.01); *H02G 3/30* (2013.01); *H05K 5/0226* (2013.01)

(58) Field of Classification Search
CPC ...... H02G 11/006; H02G 3/30; H02G 11/003; H02G 1/00; H02G 3/0443; H02G 3/0456; H02G 3/26; H02G 3/288; H02G 3/385; H02G 3/0406; H02G 1/06; H02G 3/0437; H02G 11/00; H02G 3/0468; H02G 3/32; H02G 1/1256; H02G 1/14; H02G 3/04; H02G 3/0418; H02G 3/045; H02G 3/0481; H02G 3/0487; H02G 3/0608; H02G 3/14; H02G 3/16; H02G 3/263; H02G 3/381; H01B 7/0045; H01B 7/00; H01R 2201/26; H01R 43/20; H01R 43/28; H01R 13/46; H01R 13/502; H01R 13/518; H01R 13/629; H01R 13/62933; H01R 13/665; H01R 13/6658; H01R 13/6666; H01R 13/7172; H01R 2201/20; H01R 25/006; H01R 35/02; H01R 35/04; H01R 43/048; H01R 43/052; H01R 43/26
See application file for complete search history.

(56) References Cited

U.S. PATENT DOCUMENTS 4,353,518 A * 10/1982 Taylor .................. H05K 7/1491
                                                       248/281.11
6,811,039 B2 * 11/2004 Chen ...................... A47B 96/06
                                                       211/26

(Continued)

*Primary Examiner* — William H. Mayo, III
*Assistant Examiner* — Krystal Robinson
(74) *Attorney, Agent, or Firm* — Invoke

(57) ABSTRACT

Techniques for cable management are disclosed. In some embodiments, an apparatus for managing cables comprises a base for securing the apparatus to another object and a finger for supporting a plurality of cables. The finger and the base are coupled through an interlocking mechanism providing a fixed arrangement and a pivoting arrangement such that pivoting is prevented between the finger and the base in the fixed arrangement and enabled between the finger and the base in the pivoting arrangement. The pivoting arrangement allows for support to be maintained for the plurality of cables while the finger is pivoted in relation to the base. The apparatus may further comprise a detent that provides resistance to prevent unintentional transitions between the fixed arrangement and the pivoting arrangement.

19 Claims, 4 Drawing Sheets

(56) References Cited

U.S. PATENT DOCUMENTS

| | | | |
|---|---|---|---|
| 6,945,504 B2* | 9/2005 | Chen | H02G 11/00 174/69 |
| 7,451,957 B2* | 11/2008 | Nguyen | H02G 11/00 174/69 |
| 7,480,154 B2* | 1/2009 | Lawrence | H05K 7/1491 174/72 A |
| 2005/0145582 A1* | 7/2005 | Dubon | H02G 11/00 211/26 |

* cited by examiner

HINGED CABLE MANAGEMENT SYSTEM

TECHNICAL FIELD

The present disclosure relates to cable management systems. In particular, the present disclosure relates to a multi-position cable management apparatus that may be transitioned between a rigid fixed arrangement and a movable pivoting arrangement.

BACKGROUND

Information technology (IT) infrastructures generally include a vast array of cables to power and communicatively couple various hardware components. For example, an integrated network hardware rack often contains a significant number of cables that connect hardware modules mounted to the rack. Without proper care, cables may become tangled or otherwise difficult to manage. A large entanglement of cables may lead to other problems, such as difficulty performing maintenance operations on the hardware components, restricted cable mobility, unintended cable disconnections, and inadvertent cable swapping.

One approach to managing cables involves cable labeling. According to this approach, labels are affixed or integrated directly into the cables. In some cases, cables may be color-coded by attributes. While this approach may reduce the risk of misidentifying cables, it does not prevent cables from becoming tangled, which may lead to various problems as previously mentioned.

Another approach to managing cables is to use cable ladders or cable baskets during cable installation. Cable ladders and baskets are mechanical aids that provide rigid structural support for cables. While these fixed structures help prevent unwanted cable entanglement, these solutions come at the cost of flexibility. In particular, the rigid structure of the aids and positioning of the cables may be difficult to navigate around during service operations.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings.

DETAILED DESCRIPTION

Figure 1:
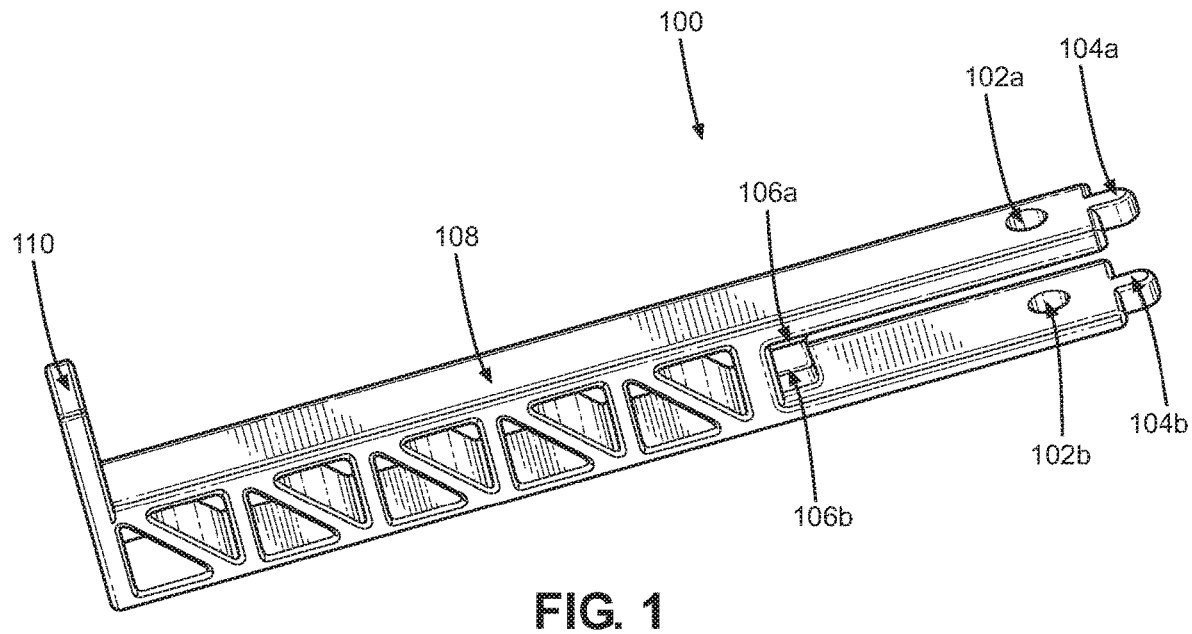
FIG. 1 illustrates a perspective view of a finger for a cable management system in accordance with some embodiments.

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW
2. CABLE SUPPORT STRUCTURES AND INTERLOCKING FEATURES
3. BASE STRUCTURE AND HINGED SOCKET FEATURES
4. FIXED AND PIVOTING ARRANGEMENTS OF THE CABLE MANAGEMENT ASSEMBLY
5. HARDWARE RACK INTEGRATION
6. MISCELLANEOUS; EXTENSIONS

1. General Overview

Techniques for providing a hinged cable management system are described herein. In some embodiments, the cable management system comprises a multi-position cable management assembly, which may be transitioned between different arrangements, including a fixed arrangement and a pivoting arrangement. In the fixed arrangement, the cable management assembly may be prevented from pivoting. In the pivoting arrangement, the cable management assembly may be rotated relative to a fixed base. In both arrangements, the multi-position cable management assembly may provide cable support to facilitate routing and positioning a plurality of cables.

Different arrangements provide flexibility by allowing a cable support structure to be positioned in a way that is optimized for different functions. For example, the cable management assembly may be arranged in a primary position to optimize function and cable support during normal deployed use. In some cases, the primary position may result in cables and/or the cable support structure preventing ease of access to one or more hardware components, such as server modules or rack slots. To optimize installation and service operations, the cable management assembly may be pivoted from the primary position to a secondary position such that the cable support assembly is moved away from a service area, thereby facilitating access.

In some embodiments, the cable management system comprises a fixed base for securing the apparatus to another object, such as an integrated network hardware rack. and a finger for supporting a plurality of cables. The finger and the fixed base may be coupled through an interlocking mechanism such that pivoting is prevented between the finger and the base in the fixed arrangement and enabled between the finger and the base in the pivoting arrangement. The pivoting arrangement may allow for support to be maintained for the plurality of cables while the finger is pivoted in relation to the base.

In some embodiments, transitions between the fixed and pivoting arrangements are controlled by an integral detent mechanism. The detent mechanism provides mechanical resistance such that unintentional transitions between the different arrangements of the cable management assembly are prevented. The detent mechanism may be configured such that the mechanical resistance may be bypassed or overcome when a transition is clearly intended, such as when a threshold amount of force is applied. In some embodiments, the detent mechanism may allow transitions to occur without the use of external tools. For example, the detent mechanism may provide resistance to prevent a pin from transitioning between two sockets unless the pin is pulled with a sufficient amount of force. The detent mechanism may thus mitigate unintended transitions while allowing service operators to efficiently switch the cable management assembly between the different arrangements through simple manual manipulation without the need for screwdrivers or other tools.

In some embodiments, the cable management system comprises a plurality of socket features. The socket features may include two or more partial cylinders connected by a channel that allows a pin feature to transition between different hinge sockets. The detent mechanism may be integrated into or affixed to the channel to provide resistance during transition of the pin from one socket to the other. A user may pull with a threshold amount of force to overcome the detent and move the pin between sockets.

In some embodiments, the socket features include two hinged sockets for transitioning the cable management system between the fixed arrangement and the pivoting arrangement. In the fixed arrangement, a pin may be coaxial a first hinge socket such that a set of base and finger features are engaged, thereby acting as multiple fixed points to positively capture the finger and stop any pivoting between finger and base. In the pivoting arrangement, the pin may be coaxial with a second hinge socket such that none of the base and finger features are engaged. Since there are no other features engaged, the finger is able to freely rotate around the hinge socket. There may be features added to finger or base that limit pivoting travel.

One or more embodiments described in this Specification and/or recited in the claims may not be included in this General Overview section.

2. Cable Support Structures and Interlocking Features

FIG. 1 illustrates a perspective view of finger 100 for a cable management assembly in accordance with some embodiments. Finger 100 comprises a plurality of cable support features, including cable support bar 108 and support tab 110. Cable support bar 108 is a mechanical aid with an elongated, rectangular shape for supporting one or more cables. Cable support bar 108 allows cables to be positioned across a substantially horizontal plane to prevent entanglement with wires that may be above or below the plane. Cable support bar 108 may further facilitate the transition from a vertical to horizontal trajectory for one or more cables.

While cable support bar 108 is depicted as having an elongated, rectangular shape, the shape and design of cable support bar 108 may vary from implementation to implementation. For example, cable support bar 108 may instead include grooves, notches, or curves instead of being a flat surface. Additionally or alternatively, cable support bar 108 may include clasps or ties to secure cables. Similarly, the shape and design of other elements of finger 100 and the cable management system described herein may vary from implementation to implementation.

Support tab 110 is located at one end of finger 100 adjacent to cable support bar 108. Support tab 110 rises above cable support bar 108 to help prevent resting cables from inadvertently sliding off finger 100 and losing contact with cable support bar 108. The shape and height of support tab 110 may vary from implementation to implementation.

Support tab 110 further comprises a set of features for coupling to a base structure of the cable support system via an interlocking mechanism. The set of features include pin locating features 102a and 102b, interlocking features 104a and 104b, and interlocking features 106a and 106b. The interlocking mechanism allows finger 100 to be transitioned between a fixed arrangement and a pivoting arrangement, as described in further detail in Section 4, titled "Fixed and Pivoting Arrangements of the Cable Management System".

Pin locating features 102a and 102b are a set of cylindrical holes configured to secure and align a pin (not shown) with integral features on a base structure. In a resting state, the pin may be threaded or otherwise positioned through both pin locating features 102a and 102b. The pin may include a pull mechanism whereby a user may pull up on the pin until one end of the pin is no longer located within one of pin locating features 102a or 102b. The catch mechanism may prevent the pin from being pulled out of the other pin locating feature. The catch mechanism may help prevent the pin from a user inadvertently pulling the pin completely out of both cylindrical holes. The pin and catch mechanism may include a spring, hydraulic resistance feature, and/or other mechanisms such that the pin reverts to its resting state when the user stops pulling on the pin. In other embodiments, the pin feature may be substantially fixed in place between pin locating features 102a and 102b such that the pin remains threaded or otherwise positioned through both pin locating features 102a and 102b, even during transitions between the fixed arrangement and the pivoting arrangement.

Pin locating features 102a and 102b, as illustrated, are fixed holes allowing for a pin that is a separate piece of assembly to be positioned and aligned. In other embodiments, the pin may be an integral piece of the assembly. For example, the pin may be an integral cylinder that is part of the finger. Stated another way, the pin may be manufactured directly into the finger, such as through a molding process.

Interlocking features 104a, 104b, 106a, and 106b fit into related integral features on a base structure when in a fixed arrangement, as described in further detail below. Interlocking features 104a and 104b are protrusions on the opposite end of finger 100 from support tab 110, with one extending from the end of cable support bar 108 and the other extending from the underside of finger 100. Interlocking features 104a and 104b may snap or otherwise fit into corresponding receiving features on a base structure. Interlocking features 106a and 106b are tabs on the interior of finger 100

Interlocking features 104a, 104b, 106a, and 106b provide four points used to positively capture finger 100 and stop any pivoting between finger 100 and a base structure. The four interlocking features allows for the resistance to be distributed across multiple points. In other embodiments, additional or fewer interlocking features may be used. Further, the location and shapes of the interlocking features may vary from implementation to implementation. For example, one or more of these features may be integrated into a base structure instead of finger 100.

In some embodiments, finger 100 is created through a molding and/or three-dimensional (3D) printing process. For example, a 3D printing or injection molding process may create finger 100 using plastic or a set of plastic composites. Additionally or alternatively, other materials may be used, such as metal, glass, rubber, silicone, and/or other polymers. The manufacturing and composition of finger 100 and other components of the cable management system described herein may vary from implementation to implementation.

3. Base Structure and Hinged Socket Features

Figure 2:
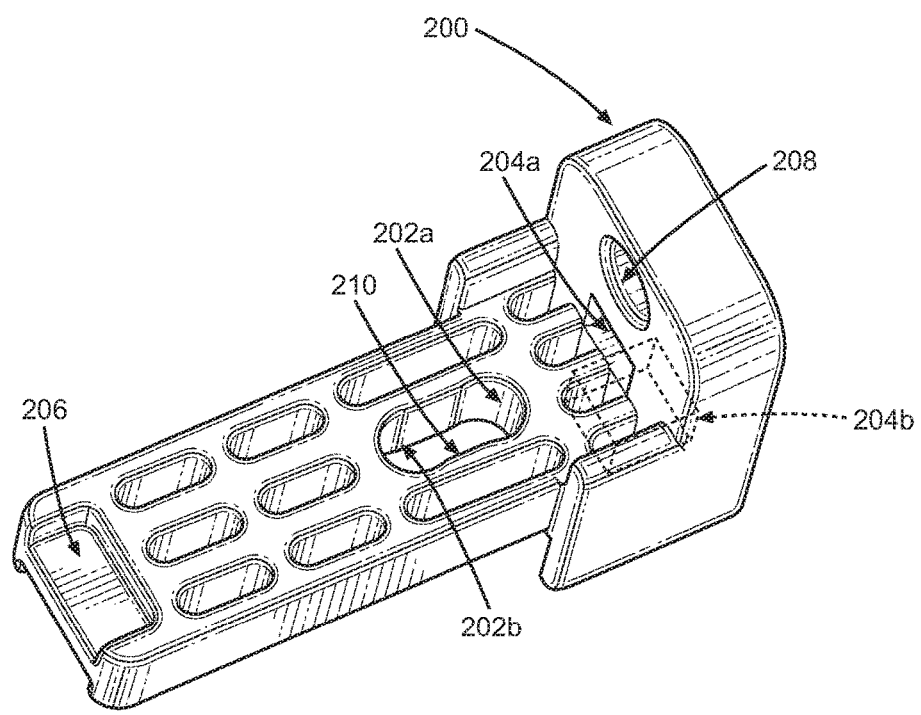
FIG. 2 illustrates an example perspective view of a base for a cable management system in accordance with some embodiments.

FIG. 2 illustrates an example perspective view of base 200 for a cable management system in accordance with some embodiments. Base 200 is configured to couple to finger 100 through an interlocking mechanism. On finger 100, the interlocking mechanism includes pin features 102a, 102b, and interlocking features 104a, 104b, 106a, and 106b, as previously described. Base 200 comprises corresponding integral features, including sockets 202a and 202b, and interlocking features 204a, 204b, and 206.

Sockets 202a and 202b are hinge sockets that are slightly larger in diameter than a pin. As described in further detail below, the pin is coaxial with socket 202a in the fixed arrangement and socket 202b in the pivoting arrangement. As can be seen, sockets 202a and 202b are partial cylinders that are connected by a channel allowing the pin feature to transition between sockets 202a and 202b.

The channel between sockets 202a and 202b includes detent 210, which provides some resistance during the transition of the pin from socket 202a to socket 202b. Detent 210 curves slightly outward into the channel to generate enough resistance to prevent pin from moving between sockets 202a and 202b unless acted upon by a threshold amount of external force. The threshold amount of force may vary depending upon the size of detent 210, which may vary from implementation to implementation. Detent 210 may allow some flex to facilitate the transition when a user is pulling on the pin.

In other embodiments, the channel between sockets 202a and 202b may be completely closed off, acting as a detent. In this case, the detent may be overcome by pulling up on the pin until it clears the detent. The pin may then be released to reengage with either socket 202a or 202b. As previously mentioned, a spring, hydraulic, or similar mechanism may be provided to reengage the spring upon release.

Base 200 further comprises mounting feature 208, which is a cylindrical hole for affixing base 200 to another object, such as an integrated network hardware rack. Mounting feature 208 may be aligned with a corresponding feature on the rack and other object. A screw or other fastening device may then be used to secure base 200 to the object. Once fastened, base 200 stays in a fixed, rigid position. Finger 100 may rotate relative to base 200 along a substantially horizontal plane when in the pivoting arrangement, as discussed further below.

Figure 3:
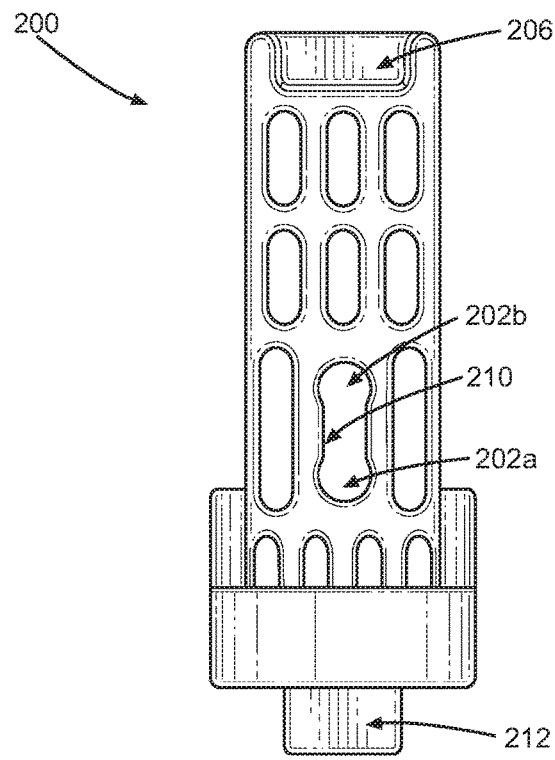
FIG. 3 illustrates an example top view of a base for a cable management system in accordance with some embodiments.

FIG. 3 illustrates an example top view of a base for a cable management system in accordance with some embodiments. From the top view, socket 202a, socket 202b, interlocking feature 206, and detent 210 can be seen. Further, alignment feature 212 may also be seen, which is a rectangular protrusion configured to fit into slots on standard network racks. Alignment feature 212 helps to secure and ensure proper alignment with a hardware rack frame during installation. In other embodiments, alignment feature 212 may be omitted or shaped differently to facilitate affixing base 200 to other objects.

Base 200 may be created through a molding and/or three-dimensional (3D) printing process, similar to finger 100. For example, a 3D printing or injection molding process may create base 200 using plastic or a set of plastic composites. Additionally or alternatively, other materials may be used, such as metal, glass, rubber, silicone, and/or other polymers. The manufacturing and composition of base 200 may vary from implementation to implementation.

4. Fixed and Pivoting Arrangements of the Cable Management Assembly

In some embodiments, finger 100 is coupled to base 200 via an interlocking mechanism which, as previously described, may include a pin, pin locating features 102a and 102b, sockets 202a and 202b, and interlocking features 104a, 104b, 106a, 106b, 204a, 204b, and 206. The interlocking mechanism allows finger 100, when coupled to base 200, to be transitioned between a fixed arrangement and a pivoting arrangement. In the fixed arrangement, finger 100 maintains a fixed position and is prevented from rotating relative to base 200. In the pivoting arrangement, finger 100 may freely rotate relative to base 200.

Figure 4:
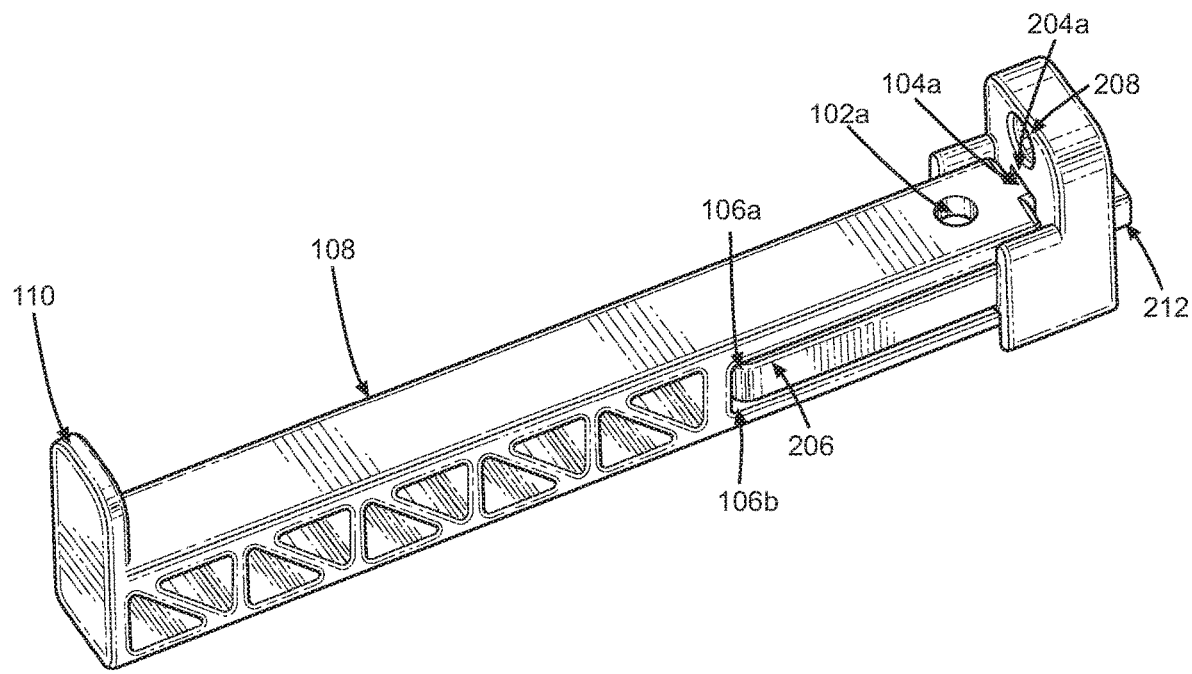
FIG. 4 illustrates an example perspective view of a cable management system in a fixed arrangement in accordance with some embodiments.

FIG. 4 illustrates an example perspective view of a cable management system in a fixed arrangement in accordance with some embodiments. In the fixed arrangement, pin locating features 102a and 102b are located directly above and below socket 202a such that a pin (not shown) is coaxial with socket 202a. Further, interlocking features 104a, 104b, 106a, and 106b on finger 100 are engaged with interlocking features 204a, 204b, and 206, respectively, on base 200. The pin/socket engagement combined with the engagement of the interlocking features act as multiple fixed points to positively capture finger 100 and stop any pivoting between finger 100 and base 200. Thus, the cable management system maintains a rigid, fixed support for cables in this arrangement.

Figure 5:
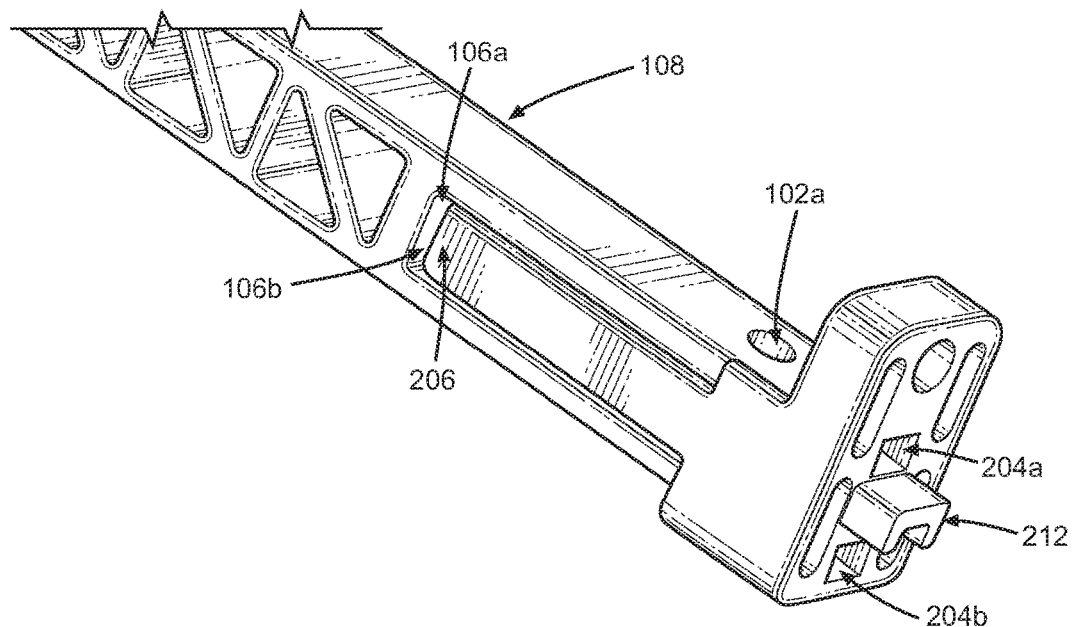
FIG. 5 illustrates another example perspective view of a cable management system in a fixed arrangement in accordance with some embodiments.

FIG. 5 illustrates another example perspective view of a cable management system in a fixed arrangement in accordance with some embodiments. Interlocking features 104a and 104b, at the end of finger 100, fit into interlocking features 204a and 204b on base 200. Interlocking features 106a and 106b engage with the top and bottom of interlocking feature 206. Base 200 may be secured to another object, such as the frame of a network rack, via mounting feature 208 and alignment feature 212.

In the fixed arrangement, detent 210 provides resistance to prevent the pin from inadvertently transitioning between socket 202a and socket 202b. In the fixed arrangement, detent 210 helps ensure that corresponding interlocking features on finger 100 and base 200 remain engaged to prevent pivoting. Thus, the cable management assembly may maintain a fixed, rigid structure to provide structural support for a set of cables.

In some embodiments, the cable management assembly may be transitioned from the fixed arrangement to the pivoting arrangement by applying enough force to overcome the resistance provided by detent 210. For example, a user may grip finger 100 and pull away from base 200 with sufficient force such that the pin moves from socket 202a to socket 202b. When a threshold amount of force is applied, detent 210 may flex enough for the pin to transition between sockets 102a and 102b. In other embodiments, a user may pull on the head of a pin to disengage the pin from the first socket and initiate the transition process. The user may then grip and pull finger 100 in a direction away from base 200 until the pin is aligned with socket 202b. The user may then release the pin such that the pin engages with socket 202b.

Figure 6:
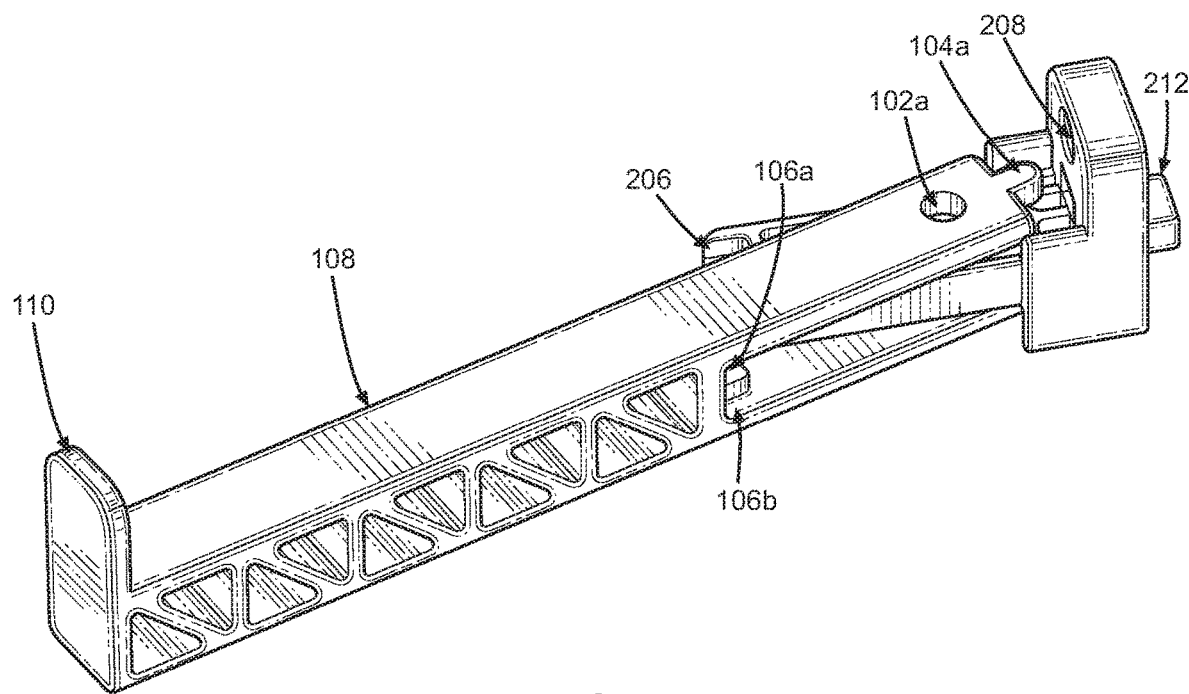
FIG. 6 illustrates a perspective view of a cable management system in a pivoting arrangement in accordance with some embodiments.

Moving the pin such that it is engaged and coaxial with socket 202b places the cable management system in the pivoting arrangement. FIG. 6 illustrates a perspective view of a cable management system in a pivoting arrangement in accordance with some embodiments. In the pivoting arrangement, interlocking features 104a and 104b are no longer engaged with corresponding interlocking features 204a and 204b on base 200. Interlocking features 106a and 106b also do not engage with interlocking feature 206. As a result, finger 100 may freely rotate around hinge socket 202b.

In some embodiments, finger 100 pivots along a substantially horizontal plane. Cable support may be maintained while pivoting along the horizontal plane to maintain structural support for the cables at the same level. Users may pivot finger 100 to a more optimal location without losing the mechanical support provided by cable support bar 108 and support tab 110.

In some embodiments, finger 100 and/or base 200 may include additional features (not shown) to limit pivoting travel. For example, finger 100 and base 200 may include additional interlocking features that engage when the finger is rotated more than a threshold angle. Once engaged, these features may prevent continued rotation in the direction that finger 100 was being pivoted.

When in the pivoting arrangement, finger 100 may be transitioned back by moving pin from socket 202b to socket 202a. For example, finger 100 may be pushed toward base 200 with sufficient force to overcome the resistance of detent 210. As another example, a user may pull up on the pin until no longer engaged with socket 202b and push on finger 100 until the pin is aligned with socket 202a. The user may then release the pin to engage the pin with 202a, placing finger 100 in the fixed arrangement.

In some embodiments, finger 100 may support fixed arrangements at multiple angles. For example, a user may pivot finger 100 with respect to base 200 while in the pivoting arrangement. The user may then transition to the fixed arrangement at the desired angle to reengage the interlocking features and prevent further pivoting. If the optimal cable support angle changes for a given function, the user may transition back to the pivoting arrangement and repeat the process until the newly desired angle is achieved.

In the examples above, base 200 included two hinge socket locations and finger 100 is configured to support a single pin through a fixed hole. In other embodiments, finger 100 may include the two hinge socket locations rather than base 200, and base 200 may include the pin alignment features. The interlocking features may also be shifted to support the reverse arrangement. For example, interlocking features 104a, 104b, 106a, and 106b may be shifted to base 200 in the reverse direction, and interlocking features 204a, 204b, and 206 may be integrated into finger 100. As previously noted, the design, shape, and location of the interlocking features may vary from implementation to implementation.

5. Hardware Rack Integration

In some embodiments, the cable management system includes a plurality of finger-base pairings. The pairings may be stacked or otherwise arranged to provide support at various vertical and/or horizontal levels. A plurality of pairings may be useful to provide mechanical aid for various hardware modules in integrated network hardware racks.

Figure 7:
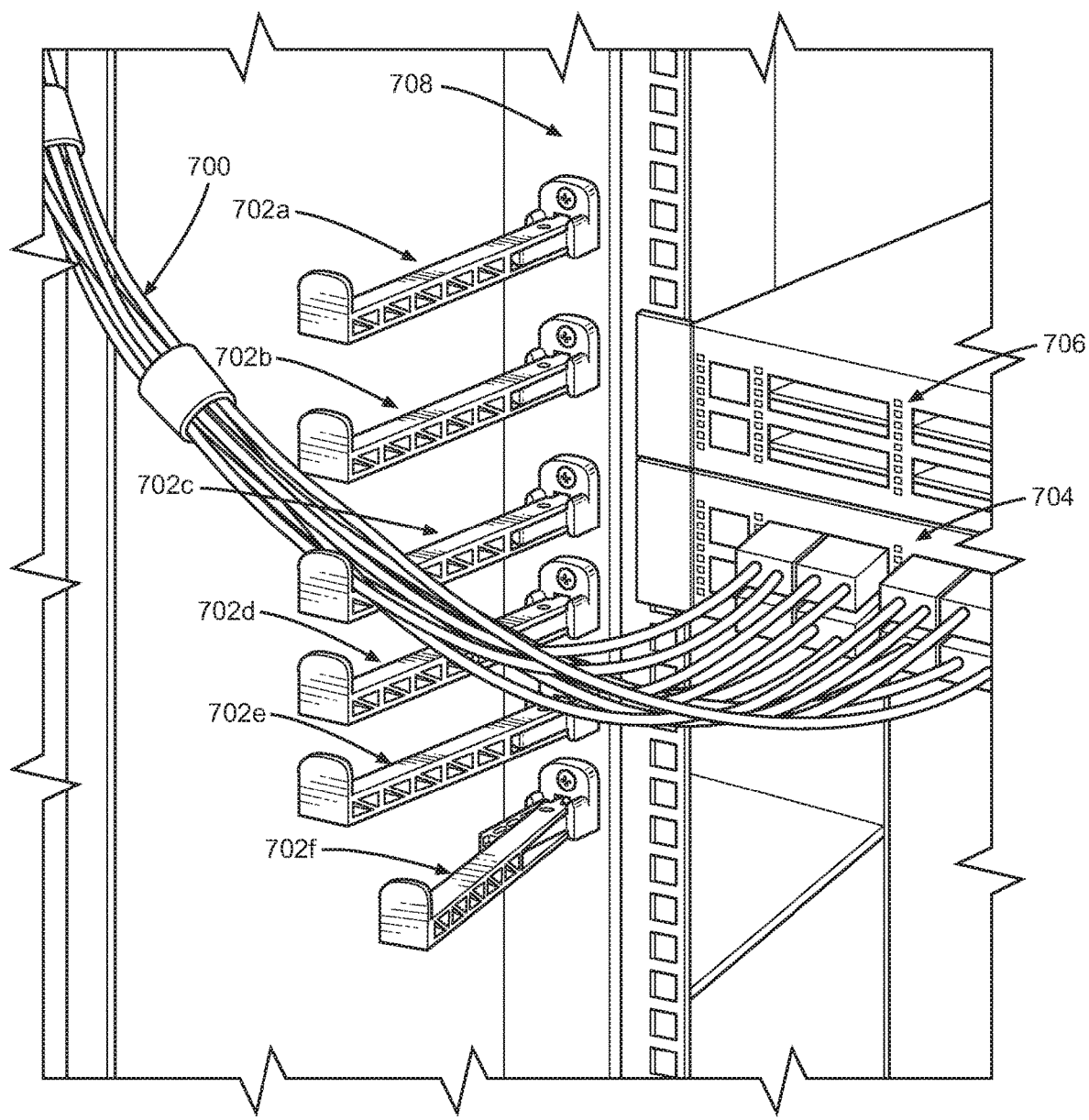
FIG. 7 illustrates a stacked set of cable management assemblies mounted to an integrated network hardware rack in accordance with some embodiments.

FIG. 7 illustrates a stacked set of cable management assemblies mounted to an integrated network hardware assembly in accordance with some embodiments. The stacked set of cable management assemblies include cable assemblies 702a-f, which are secured to rack frame 708. Cables 700 are supported by cable assembly 702c in their transition from a vertical trajectory to a horizontal trajectory. Cables 700 are coupled to hardware module 704, which is coupled to a slot within the integrated hardware rack.

Cable assemblies 702a-f provide mechanical aid for different slots in the hardware rack. For example, cable assembly 702b provides support for hardware module 706, although no cables are currently depicted. Similarly, cable assembly 702a, 702d, 702e, and 702f are configured to provide cable support for hardware modules once installed at other corresponding slots in the rack. As can be seen, different cable assemblies provide support at different vertical levels along different horizontal planes.

Cables assemblies 702a-f may be individually transitioned between the fixed arrangement to the pivoting arrangement. In view illustrated in FIG. 7, cable assemblies 702a-e are in the fixed arrangement and cable assembly 702f is in the pivoting arrangement. However, any combination of cable assemblies may be placed in the fixed arrangement and/or pivoting arrangement. The pivoting arrangement may facilitate access to hardware modules, such as hardware modules 704 and 706, and/or other components of the hardware rack during service operations.

6. Miscellaneous; Extensions

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. An apparatus for managing cables, the apparatus comprising: a base for securing the apparatus to another object and a finger for supporting a plurality of cables; wherein the base and the finger are coupled through an interlocking mechanism providing a fixed arrangement and a pivoting arrangement such that pivoting is prevented between the finger and the base in the fixed arrangement and enabled between the finger and the base in the pivoting arrangement; wherein the pivoting arrangement allows for support to be maintained for the plurality of cables while the finger is pivoted in relation to the base, wherein the interlocking mechanism includes at least a first socket, a second socket, a pin and a detent, wherein the pin is coaxial with the first socket in the fixed arrangement; wherein the pin is coaxial with the second socket in the pivoting arrangement, and wherein the detent provides resistance when transitioning the pin between the first socket and the second socket to prevent unintentional transitions between the fixed arrangement and the pivoting arrangement.

2. The apparatus of claim 1, wherein the detent prevents the pin from sliding between the first socket and the second socket unless the pin is pulled with a threshold amount of force.

3. The apparatus of claim 1, wherein the interlocking mechanism comprises a first interlocking feature on the base that engages with a second interlocking feature on the finger in the fixed arrangement to prevent pivoting; wherein the first interlocking feature is not engaged with the second interlocking feature in the pivoting arrangement.

4. The apparatus of claim 1, wherein in the pivoting arrangement, the finger is pivotable along a substantially horizontal plane.

5. The apparatus of claim 1, wherein the first socket and the second socket are part of the base.

6. The apparatus of claim 1, wherein the first socket and the second socket are part of the finger.

7. The apparatus of claim 1, wherein the finger includes a fixed hole for aligning and securing the pin.

8. The apparatus of claim 1, wherein the pin is an integrated cylinder that is part of the finger.

9. The apparatus of claim 1, wherein the base is one of a plurality of bases and the finger is one of a plurality of fingers; wherein each finger in the plurality of fingers is configured to support a different set of cables at different respective heights and interlock with different respective bases in the plurality of bases.

10. An apparatus comprising: a support to facilitate positioning a plurality of cables; a means for transitioning the support between a fixed arrangement and a pivoting arrangement such that the support is prevented from pivoting in the fixed arrangement and the support is rotatable in the pivoting arrangement while maintaining contact with the plurality of cables, wherein the means for transitioning the support between the fixed arrangement and the pivoting arrangement includes an interlocking mechanism with at least a first socket, a second socket, a pin, wherein the interlocking mechanism includes a means for transitioning the pin between a first coaxial position with the first socket in the fixed arrangement and a second coaxial position with the second socket in the pivoting arrangement and a means for providing resistance when transitioning the pin between the first socket and the second socket to prevent unintentional transitions between the fixed arrangement and the pivoting arrangement.

11. The apparatus of claim 10, further comprising means for locking the support in the fixed arrangement using a pin such that transitioning to the pivoting arrangement is prevented unless the pin is pulled with a threshold amount of force.

12. The apparatus of claim 10, further comprising means for pivoting the support along a substantially horizontal plane.

13. The apparatus of claim 10, further comprising means for supporting different sets of cables at different respective heights and pivoting different cable supports along different horizontal planes.

14. The apparatus of claim 10, further comprising means for moving the support away from a service area while in the pivoting arrangement.

15. A method comprising:
supporting a plurality of cables that are coupled to a multi-cable system with a cable management assembly that includes a finger and a base coupled via an interlocking mechanisms;
wherein the interlocking mechanism includes at least a first socket, a second socket, a pin and a detent;
transitioning the cable management assembly from a fixed arrangement to a pivoting arrangement;
wherein pivoting is prevented between the finger and the base in the fixed arrangement and enabled between the finger and the base in the pivoting arrangement;
wherein the pin is coaxial with the first socket in the fixed arrangement;
wherein the pin is coaxial with the second socket in the pivoting arrangement;
wherein the detent provides resistance when transitioning the pin between the first socket and the hinge socket to prevent unintentional transitions between the fixed arrangement and the pivoting arrangement;
after transitioning the cable management assembly from the fixed arrangement to the pivoting arrangement, pivoting the finger in relation to the base;
wherein support is maintained for the plurality of cables while the finger is pivoted in relation to the base.

16. The method of claim 15, wherein transitioning the cable management assembly from the fixed arrangement to the pivoting arrangement comprises pulling the pin from the first socket; aligning the pin with the second socket; and releasing the pin such that the pin engages with the second socket.

17. The method of claim 15, wherein the detent prevents the pin from transitioning between the first socket and the second socket unless pulled with sufficient force to disengage the pin from the first socket.

18. The method of claim 15, wherein pivoting the finger in relation to the base comprises pivoting the finger along a substantially horizontal plane.

19. The method of claim 15, wherein the finger is one of a plurality of fingers; wherein each finger in the plurality of fingers is configured to support a different set of cables at different respective heights and interlock with different respective bases in the plurality of bases.

* * * * *